United States Patent
Natsume et al.

(10) Patent No.: US 6,960,391 B2
(45) Date of Patent: Nov. 1, 2005

(54) CARRIER-ATTACHED COPPER FOIL AND PRINTED BOARD USING THE COPPER FOIL

(75) Inventors: Takashi Natsume, Ibaraki (JP); Fumiaki Akase, Ibaraki (JP)

(73) Assignee: Nikko Materials Co., Ltd., Tokyo (JP)

( * ) Notice: Subject to any disclaimer, the term of this patent is extended or adjusted under 35 U.S.C. 154(b) by 185 days.

(21) Appl. No.: 10/432,517

(22) PCT Filed: Aug. 8, 2002

(86) PCT No.: PCT/JP02/08117

§ 371 (c)(1),
(2), (4) Date: May 23, 2003

(87) PCT Pub. No.: WO03/032699

PCT Pub. Date: Apr. 17, 2003

(65) Prior Publication Data

US 2004/0048047 A1 Mar. 11, 2004

(30) Foreign Application Priority Data

Sep. 26, 2001 (JP) ............................. 2001-292773

(51) Int. Cl.$^7$ ............................................. B32B 15/04
(52) U.S. Cl. .................. 428/457; 428/195.1; 428/192; 428/418; 428/607; 428/626
(58) Field of Search ........................... 428/606, 195.1, 428/457, 901, 192, 418, 607, 626

(56) References Cited

U.S. PATENT DOCUMENTS

| | | | |
|---|---|---|---|
| 4,661,417 A | * | 4/1987 | Suzuki et al. ............... 428/607 |
| 5,709,957 A | * | 1/1998 | Chiang et al. ............... 428/615 |
| 6,562,179 B1 | | 5/2003 | Ikeguchi et al. .......... 156/307.5 |
| 6,610,417 B2 | * | 8/2003 | Andresakis et al. ........ 428/607 |
| 2002/0004124 A1 | | 1/2002 | Hirasawa et al. ........... 428/209 |
| 2004/0043327 A1 | * | 3/2004 | Sugano et al. ........... 430/280.1 |
| 2005/0003169 A1 | * | 1/2005 | Ikeguchi et al. ......... 428/195.1 |

FOREIGN PATENT DOCUMENTS

| | | | |
|---|---|---|---|
| EP | 0 960 725 A2 | 12/1999 | |
| EP | 1 097 959 A1 | 5/2001 | |
| JP | 03-112190 | 5/1991 | |
| JP | 2002-026475 | 1/2002 | |
| WO | WO 98/51485 | * 11/1998 | ............ B32B 3/00 |

OTHER PUBLICATIONS

Patent Abstracts of Japan, One page English Abstract of JP 03-112190.
Patent Abstracts of Japan, One page English Abstract of JP 2002-026475.

* cited by examiner

*Primary Examiner*—B. Shewareged
(74) *Attorney, Agent, or Firm*—Howson and Howson

(57) ABSTRACT

The present invention relates to a carrier-added copper foil and a print substrate using such copper foil characterized in comprising a resin layer and a functional material layer at least on a part of the copper foil. A carrier-added copper foil and a print substrate using such copper foil are obtained by forming an insulating layer and functional material layer having an area smaller than the area of the copper foil on the surface of the carrier-added copper foil with the screen printing method, thereby improving the handling of such copper foil, preventing the adhesion of contaminants such as resin powder on the copper foil surface during the cutting procedure, preventing scratches and dimples caused by foreign matter, and effectively preventing the generation of scratches, wrinkles and creases during the cutting, packaging and transportation procedures.

14 Claims, No Drawings

CARRIER-ATTACHED COPPER FOIL AND PRINTED BOARD USING THE COPPER FOIL

FIELD OF THE INVENTION

The present invention pertains to a carrier-added copper foil comprising a resin layer and functional material layer on the surface of the copper foil and effective in improving the handling of such copper foil as well as preventing scratches and dimples caused by foreign matter, and to a print substrate using such copper foil.

BACKGROUND OF THE INVENTION

Conventionally, a buildup wiring board is manufactured, with a network-formed print wiring board as the inner layer core material, by laminating a copper foil for a outer layer circuit on the inner layer core material via a resin-impregnated base material or in a form of a resin-added carrier foil, and thereafter forming an interlayer connection and network.

Moreover, the foregoing process is repeated to build up the outer layer circuits according to the required number of layers.

Generally, upon pressing a copper foil with a pressing or laminating machine, if foreign matter such as copper scrape or prepreg resin powder generated when cutting the copper foil adheres to the shining surface (S surface) of the copper foil, there is a problem in that such shining surface will become scratched, or foreign matter will adhere thereto. Moreover, even after lamination, there are cases where the shining surfaces would scrape against each other and become scratched when removing the copper-clad laminate from the device or overlaying such copper-clad laminates.

In recent years, the circuit width is becoming significantly small due to the miniaturization demands of electronics, and, pursuant thereto, the thickness of copper foil used in the copper-clad laminate has become less than 18 $\mu$m in consideration of the demands for copper foil with reduced thickness.

Nevertheless, the handling extremely aggravates when the thickness of the copper foil is reduced to less than 18 $\mu$m. In addition to the aforementioned pressing or laminating process, there is a problem in that the copper foil may become scratched during the ordinary cutting packaging or transportation thereof, and the shining surface of the copper foil in particular may be affected by the increased contamination of foreign matter or generation of wrinkles and creases.

As described above, when scratches, wrinkles or creases occur, particularly on the shining surface side, it will cause the disconnection and short circuit of circuits, and there is a significant problem in that this will lead to defects in the print circuit substrate and electronic equipment.

Several proposals have been made for preventing scratches, wrinkles and creases on the copper foil surface described above and improving the handling thereof. One example of such a proposal is to use a carrier of aluminum foil or copper foil and to adhere such carrier to the copper foil with an adhesive agent.

This will reinforce the foregoing ultra-thin copper foil, improve the handling of such copper foil, protect the copper foil surface during cutting; particularly the shining surface (S surface) of the copper foil, prevent contamination such as resin powder from adhering to such surface, and prevent scratches and dimples caused by foreign matter. Here, those with an aluminum carrier are generally referred to as CA (Copper Aluminum) foil.

Usually, at the subsequent step, this type of CA foil is laminated with a resin-impregnated base material, heated/pressed with a pressing device, and thereafter made into a copper-clad laminate used in a print circuit substrate. Ultimately, the foregoing aluminum carrier is peeled, and completes its role as the carrier and contaminant protective layer.

When employing the resin-added copper foil to the foregoing carrier-added copper foil, resin power would arise from the resin layer end face upon performing slit processing to the resin-added copper foil, or from the resin layer end face upon cutting after applying the carrier, and there is a problem in that the product or process would become contaminated.

Similar problems would arise when employing a functional material layer to which ferroelectrics are dispersed instead of the foregoing resin layer. Further, when forming a layer comprising the functions of an insulating layer and dielectric layer within the same substrate, buildup will be necessary for each individual layer, and problems of complicated procedures and increased costs are expected due to the increased number of substrate layers.

OBJECT OF THE INVENTION

The present invention was devised in view of the foregoing problems, and an object thereof is to provide a carrier-added copper foil comprising an insulting layer and functional resin layer and a print substrate employing such copper foil capable preventing the contamination to processes and products by suppressing the generation of resin powder as a result of preparing an insulating layer and functional resin layer within the same layer with the screen printing method on the copper surface of the carrier-added copper foil cut to a prescribed size, without having to cut the insulating layer portion and functional resin layer portion, and which is effective in improving the handling of such copper foil, and preventing scratches and dimples caused by foreign matter, as well as effectively preventing scratches, wrinkles and creases generated during the cutting, packaging or transportation thereof.

SUMMERY OF THE INVENTION

Accordingly, the present invention provides:
1. A carrier-added copper foil and print substrate using the copper foil characterized in comprising a resin layer and a functional material layer at least on a part of the copper foil;
2. A carrier-added copper foil and print substrate using the copper foil according to paragraph 1 above, characterized in that the resin layer contains the functional material layer;
3. A carrier-added copper foil and print substrate using the copper foil according to paragraph 1 or paragraph 2 above, characterized in that at least a part of the resin layer is an insulating layer;
4. A carrier-added copper foil and print substrate using the copper foil according to each of paragraphs 1 to 3 above, characterized in that at least a part of the resin layer is a functional material layer to which ferroelectrics are dispersed therein;
5. A carrier-added copper foil and print substrate using the copper foil according to each of paragraphs 1 to 4 above, characterized in that the resin layer and/or the functional material layer is applied by printing;

6. A carrier-added copper foil and print substrate using the copper foil according to each of paragraphs 1 to 5 above, characterized in that the carrier is a metal plate or metal foil or resin film; and 7. A carrier-added copper foil and print substrate using the copper foil according to each of paragraphs 1 to 6 above, characterized in that the face to be laminated with the carrier is the shining surface (S surface) of the copper foil.

DETAILED DESCRIPTION OF THE PREFERRED EMBODIMENT

As the carrier of the present invention, aluminum, copper, copper alloy, a stainless plate or foil, a resin film such as PET or the like may be used. Moreover, thermally cured carriers prepared by previously coating a thermosetting resin on aluminum, copper, copper alloy or a stainless plate or foil may also be used.

Although carries other than those listed above may be used, it is desirable to use materials which will peel easily in the subsequent process and which are obtainable at low costs. Further, materials in which an oxide film or other surface processing is applied so as to facilitate the peeling may also be used.

For example, when using an aluminum foil or sheet as the carrier (an aluminum foil or sheet is a particularly preferable material as the carrier), a flat-rolled foil of ordinary aluminum may be used, and it is not particularly necessary to limit the thickness (thinness) of the aluminum to be used. Nevertheless, it is desirable to use thin aluminum foil in terms of cost reduction. However, since the aluminum foil may not be used as the carrier if it is too thin, a certain degree of thickness is necessary.

When describing the aluminum material preferable as this type of carrier, as the quality of material, a soft type is weak in elasticity and requires a thicker thickness, and, therefore, it is preferable to use a hard type. Nevertheless, transcription to the copper foil of the rolling oil remained on the aluminum foil and the aluminum powder may occur. As a preventive measure, a thermosetting resin may be previously coated on the aluminum foil.

As the thermosetting resin to be coated on the aluminum foil, thermosetting resin such as epoxy resin, polyester resin, acrylic resin, urethane resin or the like may be used. The foregoing thermosetting resins have preferable adhesiveness to aluminum foil, and have characteristics in that their property does not change even upon heating/pressing such resins with a press or laminate after thermal curing and will not transcribe on to opponent materials.

As the "elasticity" of aluminum foil improve, an even thinner aluminum foil may be used as the carrier. Epoxy resin is particularly preferable. Although there is no particular limitation on the thickness of the thermosetting resin to be coated, a thinner resin is more preferable in terms of cost reduction.

For the lamination of aluminum foil coated with thermosetting resin and the copper foil, thermosetting resin such as epoxy resin, acrylic resin, urethane resin or the like is used. Thereby, the strength of the aluminum foil will complement the strength of the copper foil, and effectively suppress the generation of scratches, wrinkles and creases.

When the copper foil is of a rectangular sheet, the location of the aluminum foil to be laminated to the copper foil should be at least on one side end, but may also be on both side ends or on all four side ends of the rectangular sheet.

Further, the aluminum foil and copper foil may be laminated successively with a roll at both side ends. Although peeling will be easier if the location of lamination is fewer, when performing effective lamination, it is necessary to increase the location of area of lamination. This lamination mode may be suitably selected in accordance with the purpose of use.

In the present invention, all of the above may be used.

As described above, since the handling of this carrier-added copper foil such as aluminum is extremely favorable, it is possible to effectively prevent the generation of wrinkles and creases, and it is further possible to prevent the direct adhesion of foreign matter on the surface of the copper foil as a result of the cover of aluminum or the like.

Moreover, after lamination to the resin substrate, a carrier such as aluminum is peeled in order to form a network with etching processing or the like, and, since it is protected until immediately before the formation of the circuit with a carrier such as aluminum, this is effective in preventing scratches and dimples caused by foreign matter of the copper-clad laminate, and additionally prevents generation of wrinkles and creases during the cutting, packaging and transportation procedures.

Although it is preferable that the copper foil surface to be laminated with the aluminum foil or the like be applied on the shining surface (S surface), it may also be on the other surface; that is, on the mat surface (M surface). Moreover, this may also be applied on a shining surface (S surface) to which surface processing such as plating has been performed.

In the present invention, a resin layer and functional material layer formed at least on the face opposite to the face to be laminated with the carrier in a carrier-added copper foil.

By additionally forming a resin layer comprising functionality on the surface of the carrier-added copper foil, there is a significant effect in that the process can be simplified, and that a laminated circuit substrate can be manufactured with efficiency. This is a significant characteristic of the present invention. This resin layer and functional material layer may be formed (intermittently) semi-continuously in a prescribed pattern while giving a pause to the carrier-added copper foil.

Although ferroelectrics and insulating materials such as insulating layers and barium titanate are preferable as such functional material, notwithstanding the foregoing materials, other functional materials such as resistive materials, conductive materials, semiconductor materials, magnetic materials, sensor materials and so on may also be formed.

Application of such functional materials would be the easiest by printing, but other covering methods such as plating, vapor deposition (including sputtering), CVD, and so on may also be used. Upon preparing a laminate, the carrier-added copper foil with a resin layer and functional material layer added thereto is cut in a prescribed shape and size such as a rectangle.

When employing a resin-added copper foil as the carrier-added copper foil and cutting the resin layer simultaneously with the carrier-added copper foil, there is a possibility that resin fragments will adhere to the copper foil. Since such fragments will become contaminants in the subsequent process, a resin layer having an area smaller than the area of the copper foil is formed on the copper surface of the carrier-added copper foil cut to a prescribed size as described above with the screen printing method. The width of the copper foil rim may be arbitrarily set in accordance with the size of the inner layer core material.

As described above, since a functional material was added on the carrier-added copper foil, a superior effect is yielded in that the processing at the subsequent step may be significantly simplified. In addition, since this insulating layer and functional material layer are formed within a single layer in a prescribed pattern with the screen printing method on the copper face of the carrier-added copper foil cut in a prescribed size, a significant effect is yielded in that the process can be simplified and the productivity can be improved.

Next, the carrier-added copper foil to which a resin layer is formed thereon and an inner layer core material to which a circuit is formed thereon are laminated in order to form a copper-clad laminate.

To illustrate an example of the copper foil lamination process, for instance, the copper foil is heated and pressurized at a pressing pressure of 10 to 30 kg/cm$^2$ and a pressing temperature of roughly 170° C. for 60 to 180 minutes.

The bonding of the carrier-added copper foil with a resin layer formed thereon and the inner core material can thereby be sufficiently conducted. Further, since the handling of the carrier-added copper foil is extremely favorable, the generation of wrinkles and creases can be prevented.

Particularly, the handling is considerably improved when the thickness of the copper foil is less than 18 $\mu$m. Moreover, notwithstanding the foregoing pressing process, there is an effect wherein scratches, contamination by foreign matter, and generation of wrinkles and creases during ordinary cutting, packaging or transportation can be prevented.

Thus, there is an effect in that the disconnection and short circuit of print circuit substrates are reduced, defects in electronic devices are suppressed, and yield ratio of products is improved.

After the foregoing lamination, the carrier made of aluminum or the like can be easily peeled and removed. The aluminum foil or sheet (plate) for the carrier may be recycled.

This will improve the handling of ultra-thin copper foils, prevent the adhesion of contaminants such as resin powder on the copper foil surface, be effective in preventing scratches and dimples caused by foreign matter, and prevent generation of scratches, wrinkles and creases during the ordinary cutting, packaging and transportation procedures. A print circuit substrate can easily be obtained thereby.

Furthermore, as described above, a superior effect is yielded in that the manufacturing process of circuit substrates can be significantly simplified since a functional material layer is provided on the carrier-added copper foil.

EXAMPLES AND COMPARATIVE EXAMPLES

Next, the examples and comparative examples of the present invention will be explained. Further, these Examples are merely illustrative, and the present invention shall in no way be limited thereby. In other words, the present invention shall include all other modes or modifications other than these Examples within the scope of the technical spirit of this invention.

Example 1

A hard-type aluminum foil roll having a thickness of 50 $\mu$m and width of 500 mm and the shining surface (S surface) of an electrolytic copper foil roll (width 500 mm) having a thickness of 9 $\mu$m were laminated with an epoxy resin adhesive agent at the 10 mm portion of both face edges in order to obtain an aluminum carrier-added copper foil.

Next, after cutting this aluminum carrier-added copper foil to a length of 500 mm, an insulating resin was applied with screen printing in a square excluding the functional material layer with one side of 400 mm and dried thereafter in order to form an insulating layer having a coating thickness of 40 $\mu$m.

Then, resin to which barium titanate ferroelectrics are dispersed therein is applied with screen printing to the functional material layer portion in a prescribed pattern and dried thereafter in order to form a functional material layer as a capacitor (for a condenser) having a coating thickness of 40 $\mu$m. Moreover, the end portion (peripheral edge) of the copper foil without the resin is 5 mm.

In order to observe the generation of wrinkles during the lamination of the aluminum carrier-added copper foil and to view the adhesion of foreign matter to the copper foil after the lamination procedure of the copper foil, pressing was conducted for 1 hour at a pressure of 20 kg/cm$^2$ and pressing temperature of 170° C., and the copper foil surface from which the aluminum foil was peeled was observed with an optical microscope.

As a result, with Example 1, the handling was favorable, there were no generation of wrinkles, and residual attachments after the pressing could not be acknowledged at all.

Furthermore, the portion to which the barium titanate ferroelectrics were applied functioned sufficiently as a capacitor (for a condenser).

Comparative Example 1

With procedures similar to Example 1, an aluminum carrier-added copper foil having a width of 500 mm was obtained. Then, an insulating resin was successively applied at a width of 400 mm to this aluminum carrier-added copper foil and dried thereafter in order to form an insulating layer having a coating thickness of 40 $\mu$m.

Next, after cutting this aluminum carrier-added copper foil to a length of 500 mm, in order to view the adhesion of foreign matter to the copper foil after the lamination procedure of the copper foil, the copper foil surface was observed with an optical microscope after laminating the copper foil and peeling the aluminum under the same conditions as Example 1.

As a result, the handling of the aluminum carrier-added copper foil was favorable and there were no generation of wrinkles. Nevertheless, a part of the resin layer peeled during the cutting of the laminate substrate preparation procedure and residual attachments were acknowledged on the copper foil as a result thereof.

Moreover, since barium titanate ferroelectrics are not formed, it goes without saying that a capacitor (for a condenser) function is not provided. Therefore, in order to provide a dielectric function, a troublesome process of having to newly form a dielectric layer on the resin of the respectively cut copper foil was required.

Accordingly, it has become evident that previously forming a resin layer and various functional material layers on the carrier-added copper foil yields a superior effect in that the manufacturing process of circuit substrates can be significantly simplified. Further, although the foregoing is the result of examining the aluminum carrier-added copper foil, similar results were obtained in cases of using other carriers.

A superior effect is yielded in that a print circuit substrate can be easily obtained which is capable of improving the handling of ultra-thin copper foils, preventing the adhesion of contaminants such as resin powder on the copper foil surface, preventing scratches and dimples caused by foreign matter, and preventing the generation of scratches, wrinkles and creases during the cutting, packaging and transportation procedures, and, in addition, the manufacturing process of circuit substrates can be significantly simplified by forming a functional material layer on the carrier-added copper foil.

What is claimed is:

1. A carrier-added copper foil, comprising:
   a copper foil laminated to a carrier, said carrier being selected from a group consisting of a metal plate, a metal foil, and a resin film, and said carrier-added copper foil being cut to a prescribed size; and
   a resin layer and a functional material layer formed adjacent to each other on a face of said copper foil opposite said carrier, said resin layer having an area smaller than an area of said face of said copper foil excluding a peripheral edge of said copper foil, and said functional material layer being of a material selected from a group consisting of an insulating material, a resistance material, a conductive material, and a magnetic material.

2. A carrier-added copper foil according to claim 1, wherein at least a part of said resin layer is an insulating layer.

3. A carrier-added copper foil according to claim 2, wherein said functional material layer has ferroelectrics dispersed therein.

4. A carrier-added copper foil according to claim 3, wherein at least one of said resin layer and said functional material layer is a printed layer.

5. A carrier-added copper foil according to claim 4, wherein said copper foil has a shining surface face (S surface) that is laminated to said carrier.

6. A carrier-added copper foil, comprising:
   a copper foil laminated to a carrier; and
   a resin layer and a functional material layer formed adjacent to each other on a face of said copper foil opposite said carrier;
   said functional material layer having ferroelectrics dispersed therein.

7. A carrier-added copper foil according to claim 6, wherein at least one of said resin layer and said functional material layer is a printed layer.

8. A carrier-added copper foil according to claim 6, wherein said carrier is selected from a group consisting of a metal plate, a metal foil, and a resin film.

9. A carrier-added copper foil according to claim 6, wherein the copper foil has a shining surface face (S surface) that is laminated to said carrier.

10. A printed substrate, comprising:
    a carrier-added copper foil formed by a copper foil laminated to a carrier selected from a group consisting of a metal plate, a metal foil, and a resin film, said carrier-added copper foil being cut to a prescribed size; and
    a resin layer and a functional material layer formed adjacent to each other on a face of said copper foil opposite said carrier, said resin layer having an area smaller than an area of said face of said copper foil excluding a peripheral edge of said copper foil, and said functional material layer being of a material selected from a group consisting of an insulating material, a resistance material, a conductive material, and a magnetic material.

11. A printed substrate according to claim 10, wherein at least a part of said resin layer is an insulating layer.

12. A printed substrate according to claim 10, wherein said functional material layer has ferroelectrics dispersed therein.

13. A printed substrate according to claim 10, wherein at least one of said resin layer and said functional material layer is a printed layer.

14. A printed substrate according to claim 10, wherein said copper foil has a shining surface face (S surface) that is laminated to said carrier.

* * * * *